US009866188B2

(12) United States Patent
Chang et al.

(10) Patent No.: US 9,866,188 B2
(45) Date of Patent: Jan. 9, 2018

(54) DEAD TIME CIRCUIT FOR A SWITCHING CIRCUIT AND A SWITCHING AMPLIFIER

(71) Applicant: Nanyang Technological University, Singapore (SG)

(72) Inventors: Joseph Sylvester Chang, Singapore (SG); Tong Ge, Singapore (SG); Linfei Guo, Singapore (SG)

(73) Assignee: Nanyang Technological University, Singapore (SG)

(*) Notice: Subject to any disclaimer, the term of this patent is extended or adjusted under 35 U.S.C. 154(b) by 0 days.

(21) Appl. No.: 15/122,577

(22) PCT Filed: Apr. 2, 2015

(86) PCT No.: PCT/SG2015/050061
§ 371 (c)(1),
(2) Date: Aug. 30, 2016

(87) PCT Pub. No.: WO2015/152834
PCT Pub. Date: Oct. 8, 2015

(65) Prior Publication Data
US 2017/0070200 A1 Mar. 9, 2017

Related U.S. Application Data

(60) Provisional application No. 61/974,198, filed on Apr. 2, 2014.

(51) Int. Cl.
H03F 3/217 (2006.01)
H03K 5/151 (2006.01)
(Continued)

(52) U.S. Cl.
CPC ......... H03F 3/2171 (2013.01); H03F 3/2173 (2013.01); H03K 5/1515 (2013.01);
(Continued)

(58) Field of Classification Search
CPC .. H03F 3/2171; H03F 2200/351; H03F 3/217; H03F 3/2173; H03F 3/38;
(Continued)

(56) References Cited

U.S. PATENT DOCUMENTS 6,288,605 B1 9/2001 Botti et al.
7,633,336 B2 * 12/2009 Bean ..................... H03F 3/2173
330/10

(Continued)

FOREIGN PATENT DOCUMENTS

JP 2009021903 A 1/2009
JP 2013120947 A 6/2013
(Continued)

OTHER PUBLICATIONS

International Search Report for Application No. PCT/SG2015/050061 dated Jun. 23, 2015.
(Continued)

Primary Examiner — Khanh V Nguyen
(74) Attorney, Agent, or Firm — Lerner, David, Littenberg, Krumholz & Mentlik, LLP

(57) ABSTRACT

A dead time circuit (750) for a switching circuit is disclosed. The dead-time circuit comprises: an input (752) for receiving a switching signal of the switching circuit with at least one supply rail having a ground bounce signal; first and second outputs (754a, 754b); a first feedforward path (756) coupled to the first output and arranged to receive the switching signal; a second feedforward path (758) coupled to the second output and arranged to receive the switching signal; a first feedback path (760) forming a first feedback loop between the first output and the second feedforward path; and a second feedback path (762) forming a second feedback loop between the second output and the first feedforward path; wherein each of the first and second (Continued)

feedforward paths includes a respective first and second delay circuit (764a, 764b), each having a time delay greater than a predetermined time period of the ground bounce signal. A switching amplifier is also disclosed.

25 Claims, 11 Drawing Sheets

(51) Int. Cl.
*H03K 17/16* (2006.01)
*H03K 17/284* (2006.01)

(52) U.S. Cl.
CPC ......... *H03K 17/162* (2013.01); *H03K 17/284* (2013.01); *H03F 3/217* (2013.01); *H03F 2200/351* (2013.01); *H03F 2200/432* (2013.01)

(58) Field of Classification Search
CPC ........ H03F 2200/432; H03F 1/04; H03F 1/34; H03F 1/26; H03F 1/0227; H03F 2200/451; H03F 2200/504; H03F 3/24; H03F 1/0211; H03F 2200/66; H03F 2200/264; H03F 2203/45288; H03F 2203/7239; H03K 17/162; H03K 17/284; H03K 5/1515; H03K 17/16
USPC ........................................ 330/10, 207 A, 251
See application file for complete search history.

(56) References Cited

U.S. PATENT DOCUMENTS

| | | | |
|---|---|---|---|
| 7,733,170 B2* | 6/2010 | Cheng | H03F 1/32 330/10 |
| 8,866,544 B2* | 10/2014 | Llewellyn | H03F 3/217 330/10 |
| 9,564,862 B2* | 2/2017 | Hoyerby | H03F 3/217 |
| 2009/0027121 A1 | 1/2009 | Kawai et al. | |
| 2011/0133836 A1* | 6/2011 | Yu | H03F 3/217 330/251 |

FOREIGN PATENT DOCUMENTS

| | | |
|---|---|---|
| JP | 2013175908 A | 9/2013 |
| WO | 2013130731 A1 | 9/2013 |

OTHER PUBLICATIONS

J. S. Chang, M. T. Tan, Z. Cheng, and Y.-C. Tong, "Analysis and design of power efficient class D amplifier output stages," IEEE Transactions on Circuits and Systems I: Fundamental Theory and Applications, vol. 47, pp. 897-902, 2000.
T. Ge and J. S. Chang, "Modeling and Technique to Improve PSRR and PS-IMD in Analog PWM Class-D Amplifiers," IEEE Transactions on Circuits and Systems II: Express Briefs, vol. 55, pp. 512-516, 2008.
W. Shu and J. S. Chang, "THD of Closed-Loop Analog PWM Class-D Amplifiers," IEEE Transactions on Circuits and Systems I: Regular Papers, vol. 55, pp. 1769-1777, 2008.
C. Youngkil, T. Wonho, Y. Younghyun, R. Jeongjin, K. Sunwoo, and K. Jinseok, "A 0.018% THD+N, 88-dB PSRR PWM Class-D Amplifier for Direct Battery Hookup," IEEE Journal of Solid-State Circuits, vol. 47, pp. 454-463, 2012.
T. Ge and J. S. Chang, "Bang-Bang Control Class D Amplifiers: Total Harmonic Distortion and Supply Noise," IEEE Transactions on Circuits and Systems I: Regular Papers, vol. 56, pp. 2353-2361, 2009.
E. Gaalaas, B. Y. Liu, N. Nishimura, R. Adams, and K. Sweetland, "Integrated stereo Delta-Sigma class D amplifier," IEEE Journal of Solid-State Circuits, vol. 40, pp. 2388-2397, 2005.
G. Pillonnet, R. Cellier, N. Abouchi, and M. Chiollaz, "An integrated class D audio amplifier based on sliding mode control," in Integrated Circuit Design and Technology and Tutorial, pp. 117-120, 2008.
M. A. Rojas-Gonzalez and E. Sanchez-Sinencio, "Design of a Class D Audio Amplifier IC Using Sliding Mode Control and Negative Feedback," IEEE Transactions on Consumer Electronics, vol. 53, pp. 609-617, 2007.
M. Badaroglu, G. Van Der Plas, P. Wambacq, L. Balasubramanian, K. Tiri, I. Verbauwhede, et al., "Digital circuit capacitance and switching analysis for ground bounce in ICs with a high-ohmic substrate," IEEE Journal of Solid-State Circuits, vol. 39, pp. 1119-1130, 2004.
J. Hailong and V. Kursun, "Ground-Bouncing-Noise-Aware Combinational MTCMOS Circuits," IEEE Transactions on Circuits and Systems I: Regular Papers, vol. 57, pp. 2053-2065, 2010.
P. Heydari and M. Pedram, "Ground bounce in digital VLSI circuits," IEEE Transactions on Very Large Scale Integration (VLSI) Systems, vol. 11, pp. 180-193, 2003.
A. Kabbani and A. J. Al-Khalili, "Estimation of ground bounce effects on CMOS circuits," IEEE Transactions on components and Packaging Technologies, vol. 22, pp. 316-325, 1999.
A. Matamura, N. Nishimura, and L. Bill Yang, "Filterless multi-level delta-sigma Class D amplifier for portable applications," in IEEE International Symposium on Circuits and Systems, pp. 1177-1180, 2009.
M. A. Rojas-Gonzalez and E. Sanchez-Sinencio, "Two Class D audio amplifiers with 89/90% efficiency and 0.02/0.03% THD+N consuming less than 1mW of quiescent power," in ISSCC Dig. Tech. Papers, pp. 450-451, 2009.
W. Shu and J. S. Chang, "THD of Closed-Loop Analog PWM Class D Amplifiers," IEEE Transactions on Circuits and Systems I: Regular Papers, vol. 55, pp. 1769-1777, 2008.

* cited by examiner (a) (Prior Art)

(b)

(c)

(a)

(b)

US 9,866,188 B2

DEAD TIME CIRCUIT FOR A SWITCHING CIRCUIT AND A SWITCHING AMPLIFIER

CROSS REFERENCE TO RELATED APPLICATIONS

The present application is a national phase entry under 35 U.S.C. §371 of International Application No. PCT/SG2015/050061, filed Apr. 2, 2015, which claims priority from U.S. Provisional Patent Application No. 61/974,198, filed Apr. 2, 2014, the disclosures of which are incorporated by reference herein.

FIELD

The present invention relates to a dead time circuit for a switching circuit, and also a switching amplifier.

BACKGROUND

Class D amplifiers (CDAs) are becoming ubiquitous due to their significantly higher power-efficiency characteristics over their linear counterparts. For example, the commercial market size for CDAs in 2012 was estimated to be worth about two billion devices that incorporate CDAs (implemented in discrete/SoCs form factors), such as in smartphones, tablets, TVs, audio amplifiers, radios and the like. The attribute of CDAs having high power-efficiency is largely due to digital-like switching operation of associated output stages, in which power transistors arranged therein function as switches with low on-resistance. The high power-efficiency attribute is highly desirable as it translates to longer battery lifespan and elimination of usage of (or at least requires smaller) heat sinks.

Referring to FIG. 1, a CDA 100 typically comprises analog signal-processing circuits 102 (which may include an integrator 104, a modulator 106, a carrier generator 108, and a feedback network 110), and an output stage 112 (which may drive a load such as a loudspeaker 114). The integrator 104 provides a high loop-gain to suppress unwanted noise and distortions. The modulator 106 modulates output of the integrator 104 to a digital-like pulse signal. The output stage 112 buffers the pulse signal and drives the loudspeaker 114 by switching on/off the associated output transistors. The feedback network 110 feeds the output (from the output stage 112) back to the integrator 104 to form a closed-loop, thereby improving the linearity characteristics of the CDA 100 by means of negative feedback. The modulation techniques that may be adopted by the CDA 100 include Pulse Width Modulation (PWM), Bang-Bang control modulation, Sigma-Delta modulation, and Self-Oscillation modulation. Amongst those techniques, PWM is most commonly used because of its simple hardware requirement and high linearity characteristics. The Bang-Bang control modulation, on the other hand, is the most power-efficient for micro-power low voltage applications (e.g. hearing aids) because of its simplest hardware requirement. Although Sigma-Delta modulation and Self-Oscillation modulation potentially feature higher linearity than PWM and Bang-Bang control modulation, this advantage is however achieved at a cost of increased hardware complexity, and hence leading to lower power-efficiency.

Irrespective of the modulation techniques utilized, a congruity in the design of CDAs is the ground-bounce (noise) generated due to the switching operation of the output stage(s) of the CDAs. The ground-bounce is defined as large voltage spikes (on the otherwise clean supply rails), which may result in significant reliability degradation and compromise the linearity performance of CDAs. FIGS. 2a and 2b respectively depict an ideal and a practical switching waveform 200, 250 of an output stage of a CDA. Specifically in FIG. 2b, the ground-bounce, occurring immediately after rise and fall of the practical switching waveform 250, is clearly apparent.

So due to ground-bounce, false switching in the output stage may occur, hence degrading the performance (including reliability and/or linearity). To illustrate the issue of false switching in the Class D output stage due to ground-bounce, schematics of a PWM CDA 300 is first depicted in FIG. 3. The different stages of the PWM CDA 300 are labeled with the same reference numerals as per FIG. 1 simply for ease of explanation and referencing. For good order, it is to be appreciated that the analysis below is also applicable to Class D amplifiers which use other modulation techniques, besides PWM. With reference to FIG. 3, false switching arises because 'disturbances' (due to ground-bounce) at the integrator outputs (i.e. see circuit points in FIG. 3 labeled as $V_{int-p}$ and $V_{int-n}$) and at the carrier output (i.e. see circuit point labeled as $V_C$) are different.

To illustrate the mechanisms of erroneous PWM pulses, consider a practical case in FIGS. 4a and 4b which respectively depicts critical ground-bounce coupling paths (i.e. shown as dashed lines in each figure) from various ground-bounce 'sources' (i.e. see circuit points in FIGS. 4a and 4b labeled as $V_{out-p}$, $AV_{GND}$ and $AV_{DD}$) to an output of the integrator 104 (i.e. $V_{int-p}$) and an output of the carrier generator 108 (i.e. $V_C$). For illustration simplicity, only the upper differential branch of an op-amp (i.e. Op) is depicted in FIG. 4a. It is also to be appreciated that circuit points in FIG. 4a labeled as $M_{n-p}$ and $M_{p-p}$ are the output stage transistors of the said op-amp, Op.

There are four coupling paths in the integrator 104 (as per FIG. 4a) and three coupling paths in the carrier generator 108 (as per FIG. 4b). The noise seen at $V_{int-p}$ is different from the noise at $V_C$. Specifically, it may be seen that the noise at $V_{int-p}$ is due to ground-bounce on $PV_{DD}$ and $PV_{GND}$ (i.e. $V_{out-p}$ is connected to $PV_{DD}$ and $PV_{GND}$ through output power transistors; see FIG. 3), and on $AV_{GND}$ and $AV_{GND}$, and is coupled through $R_{fb1}$, $C_{int1}$, $C_{int3}$, $R_{z1}$ and $M_{p-p}$ and $M_{n-p}$. On the other hand, from FIG. 4b, the noise at $V_C$ is mainly due to ground-bounce on $AV_{DD}$ and $AV_{GND}$, and is coupled through two current mirrors (i.e. each being a current source, I) and a capacitor, $C_C$. This difference between the noise at $V_{int-p}$ and at $V_C$ is interesting and arguably somewhat counter-intuitive, because ground-bounce is typically assumed to be common noise. Conversely, because of the said difference and depending on a degree of difference (in magnitude and phase), false switching may inadvertently occur. For instance, a scenario of false switching in a CDA is depicted in FIG. 5, where the ground-bounce markedly disturbs $V_C$ while the disturbance to $V_{int-p}$ is comparatively lesser, and it is this difference that consequentially gives rise to false switching.

To mitigate false switching, a conventional solution proposes using a comparator with a wide hysteresis (having a difference between upper and lower thresholds larger than the noise) and a long(er) response time to de-sensitize the CDA to the noise across its inputs. However, in PWM CDAs, a comparator generally tends to be used as the PWM modulator and typically features small-to-moderate hysteresis (i.e. on the order of a few mVs) and with relatively short response-time (i.e. of about a few nanoseconds) because a large hysteresis and/or long response time reduces the output dynamic range of the CDA and increases the overall delay.

Furthermore, the ground-bounce spikes generated may be as high as a few hundred mVs and hence, a hysteresis of the said range is unrealistic practically.

Hence, the comparator is impervious to the ground-bounce only if the magnitude of the noise is small (i.e. lesser than the hysteresis of the comparator) and transiently fast-changing (i.e. of a high-frequency). It is well recognized that circuits with large switching currents, including CDAs (which includes audio CDAs and high-speed Class D supply modulator for power RF power amplifiers), switching mode power supply (DC-DC Converters), and other circuits with switching signals (with large current flow), tend to generate substantial ground-bounce, which consequently leads to significant performance degradation (such as reliability and/or linearity (e.g. Total Harmonic Distortion (THD)). Conventional design methodologies and practices to mitigate the ground-bounce noise are largely still empirical in nature, and the mechanisms for a CDA thereto are also largely uninvestigated.

Another issue CDAs commonly face is their high susceptibility to power supply noise, which is quantified and qualified by Power Supply Rejection Ratio (PSRR) and Power-Supply Induced Intermodulation Distortion (PS-IMD). By means of negative feedback, the PSRR and PS-IMD may be improved by increasing the loop-gain of the CDA, which is a well-established technique. Conventional methods to increase the loop-gain often include applying multiple feedbacks, but typically limited to two feedback loops. Due to stability issues, triple (or more) feedback loops are difficult to realize or that their loop-gain may need to be reduced, in some cases, to even a lower level obtainable from a double-feed back.

To further explain, FIG. 6 depicts schematics of a conventional double-feedback PWM CDA 600, in which a loop filter thereof comprises two second order integrators. It is to be appreciated that compared to single-feedback PWM CDAs or double feedback PWM CDAs with first order integrators, the loop gain of the double-feedback PWM CDA 600 with second order integrators is significantly higher. In the loop filter of the double-feedback PWM CDA 600, there are configured a total of four poles and two zeros and for stability sake, positioning of the poles and zeros need to be carefully designed and the loop gain is also reduced significantly. Moreover, using multiple (i.e. triple or more) feedback loops result in instability or that the loop gain is only comparable (to a double feedback loop), despite using more feedback loops.

One object of the present invention is therefore to address at least one of the problems of the prior art and/or to provide a choice that is useful in the art.

SUMMARY

According to a $1^{st}$ aspect of the invention, there is provided a dead time circuit for a switching circuit. The dead-time circuit comprises (i) an input for receiving a switching signal of the switching circuit with at least one supply rail having a ground bounce signal; (ii) first and second outputs; (iii) a first feedforward path coupled to the first output and arranged to receive the switching signal; (iv) a second feedforward path coupled to the second output and arranged to receive the switching signal; (v) a first feedback path forming a first feedback loop between the first output and the second feedforward path; and (vi) a second feedback path forming a second feedback loop between the second output and the first feedforward path; wherein each of the first and second feedforward paths includes a respective first and second delay circuit, each having a time delay greater than a predetermined time period of the ground bounce signal.

Advantageously, the proposed dead time circuit is able to block and prevent ground-bounce-induced short pulses from propagating to gates of the outputs, thereby eliminating the issue of false switching. Needless to say, this improves the reliability and/or linearity characteristics of the switching circuit.

Preferably, the first feedforward path may include a first logic gate for receiving the switching signal and an output signal from the second output via the second feedback path.

Preferably, the second feedback path may include a second logic gate.

Preferably, the second logic gate may include an inverter.

Preferably, the first logic gate's output may be coupled to an input of the first delay circuit, and the first delay circuit's output may be coupled to a first driver for boosting a first delayed signal from the first delay circuit.

Preferably, the second feedforward path may include a third logic gate for receiving the switching signal and an output signal from the first output via the first feedback path.

Preferably, the first feedback path may include a fourth logic gate.

Preferably, the fourth logic gate may include an inverter or a Level Shifter.

Preferably, the third logic gate's output may be coupled to an input of the second delay circuit, and the second delay circuit's output may be coupled to a second driver for boosting a second delayed signal from the second delay circuit.

Preferably, the second feedforward path may include third and fourth logic gates, the third logic gate for receiving the switching signal, the fourth logic gate for receiving the third logic gate's output and an output signal from the first output via the first feedback path.

Preferably, the third and fourth logic gates may respectively include an inverter and an AND gate.

Preferably, the first feedforward path may include first and second logic gates, the first logic gate for receiving the switching signal, the second logic gate for receiving the first logic gate's output and an output signal from the second output via the second feedback path.

Preferably, the first and second logic gates may respectively include an inverter and a NOR gate.

According to a $2^{nd}$ aspect of the invention, there is provided a switching circuit for generating a switching signal, the switching circuit comprising: a loop filter for producing a filtered signal from an input signal; a modulator for modulating the filtered signal to produce a modulated switching signal; and an output stage including a dead time circuit according to any preceding claim, wherein the modulated switching signal is delayed by the first and second delay circuits to generate the switching signal for driving a load.

Preferably, the modulator may include a pulse width modulator, bang-bang control modulator, Sigma-Delta modulator or self-oscillation modulator.

Preferably, the switching circuit may be in the form of an amplifier or a DC-DC converter.

According to a $3^{rd}$ aspect of the invention, there is provided a switching amplifier comprising: an inner feedback loop; and an outer feedback loop having a loop gain and comprises a first integrator with at least one zero and a second integrator; wherein the inner feedback loop includes a closed-loop gain comprising the second integrator of the outer feedback loop, the closed-loop gain of the inner feedback loop having at least one pole; the first integrator having a reactive element configured to generate a zero to at least partially cancel the at least one pole of the closed-loop gain of the inner feedback loop.

Advantageously, the inner and outer feedback loops (which collectively form a loop filter) are configured to improve the loop gain of the switching amplifier (e.g. by about more than 10 dB), which consequently translates to significant improvements in PSRR and PS-IMD. Also, since the phase-shift of the loop gain of this double-feedback arrangement is comparable to that of a single feedback arrangement, realization of a triple feedback switching amplifier with significantly higher loop gain is easily possible.

Preferably, the first integrator may have three poles and a further zero, and the closed-loop gain of the inner feedback loop may have one zero and a further pole.

Preferably, the further zero of the first integrator may at least partially cancel the further pole of the closed-loop gain of the inner feedback loop.

Preferably, the reactive element may emulate an inductor.

Preferably, the inductor may include a transconductance circuit.

Preferably, the switching amplifier may further comprise a modulator wherein the second integrator's input is electrically coupled to an output of the first integrator and to an amplifier output for producing an amplified signal, and the second integrator's output is electrically coupled to an input to the modulator, and wherein the first integrator's input is electrically coupled to the amplifier output.

Preferably, the first integrator's input may also be electrically coupled to an amplifier input for receiving a signal to be amplified.

Preferably, the switching amplifier may further comprise a third feedback loop having a third integrator, the third integrator's input being electrically coupled to an amplifier input for receiving a signal to be amplified, and to the amplifier output.

Preferably, the switching amplifier may comprise an output stage having a dead time circuit. The dead time circuit may comprise (i) an input for receiving a switching signal of a switching circuit with at least one supply rail having a ground bounce signal; (ii) first and second outputs; (iii) a first feedforward path coupled to the first output and arranged to receive the switching signal; (iv) a second feedforward path coupled to the second output and arranged to receive the switching signal; (v) a first feedback path forming a first feedback loop between the first output and the second feedforward path; and (vi) a second feedback path forming a second feedback loop between the second output and the first feedforward path; wherein each of the first and second feedforward paths includes a respective first and second delay circuit, each having a time delay greater than a predetermined time period of the ground bounce signal.

According to a $4^{th}$ aspect of the invention, there is provided a switching amplifier comprising: an inner feedback loop; an outer feedback loop having a loop gain and comprises a first integrator with at least one zero and a second integrator; wherein the inner feedback loop includes a closed-loop gain comprising the second integrator of the outer feedback loop, the closed-loop gain of the inner feedback loop having at least one pole; the first integrator having a reactive element configured to generate a zero to at least partially cancel the at least one pole of the closed-loop gain of the inner feedback loop; and an output stage having a dead time circuit wherein the dead time circuit comprises: (i) an input for receiving a switching signal of a switching circuit with at least one supply rail having a ground bounce signal; (ii) first and second outputs; (iii) a first feedforward path coupled to the first output and arranged to receive the switching signal; (iv) a second feedforward path coupled to the second output and arranged to receive the switching signal; (v) a first feedback path forming a first feedback loop between the first output and the second feedforward path; and (vi) a second feedback path forming a second feedback loop between the second output and the first feedforward path; wherein each of the first and second feedforward paths includes a respective first and second delay circuit, each having a time delay greater than a predetermined time period of the ground bounce signal.

It should be apparent that features relating to one aspect of the invention may also be applicable to the other aspects of the invention.

These and other aspects of the invention will be apparent from and elucidated with reference to the embodiments described hereinafter.

BRIEF DESCRIPTION OF THE DRAWINGS

Embodiments of the invention are disclosed hereinafter with reference to the accompanying drawings, in which:

FIG. 10 is a block diagram of the double-feedback PWM CDA of FIG. 9a, in which an inner feedback loop is realized within a shaded area shown in FIG. 9a;

DETAILED DESCRIPTION OF PREFERRED EMBODIMENTS

1. A Ground-Bounce-Insensitive Dead Time Circuit

Figure 7:
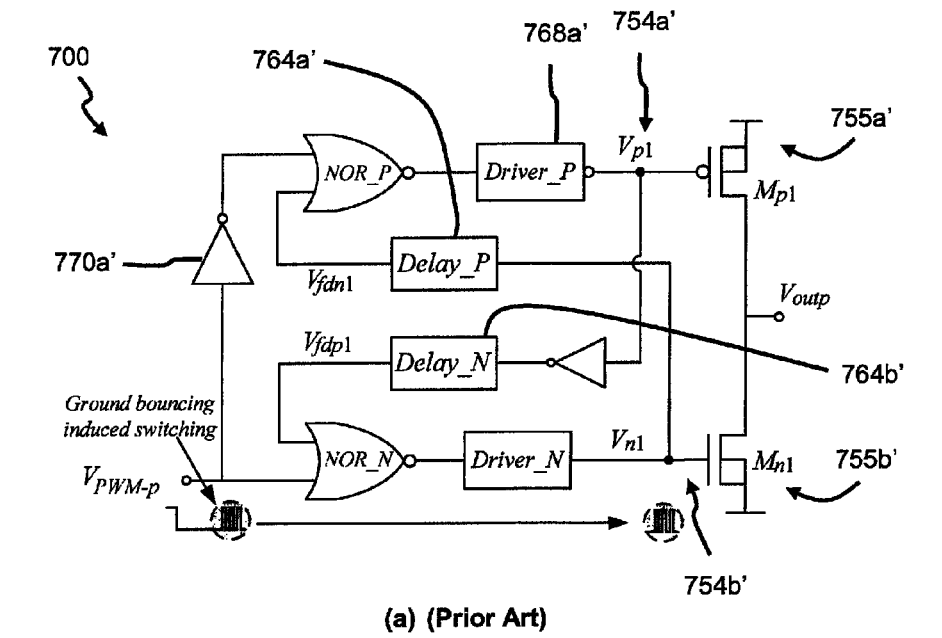
FIG. 7 includes FIGS. 7a and 7b, which respectively shows a conventional dead-time circuit and a dead-time circuit (based on a first embodiment) configured to be used in an upper branch of a CDA bridge-tied load (BTL) output stage.
Figure 7:
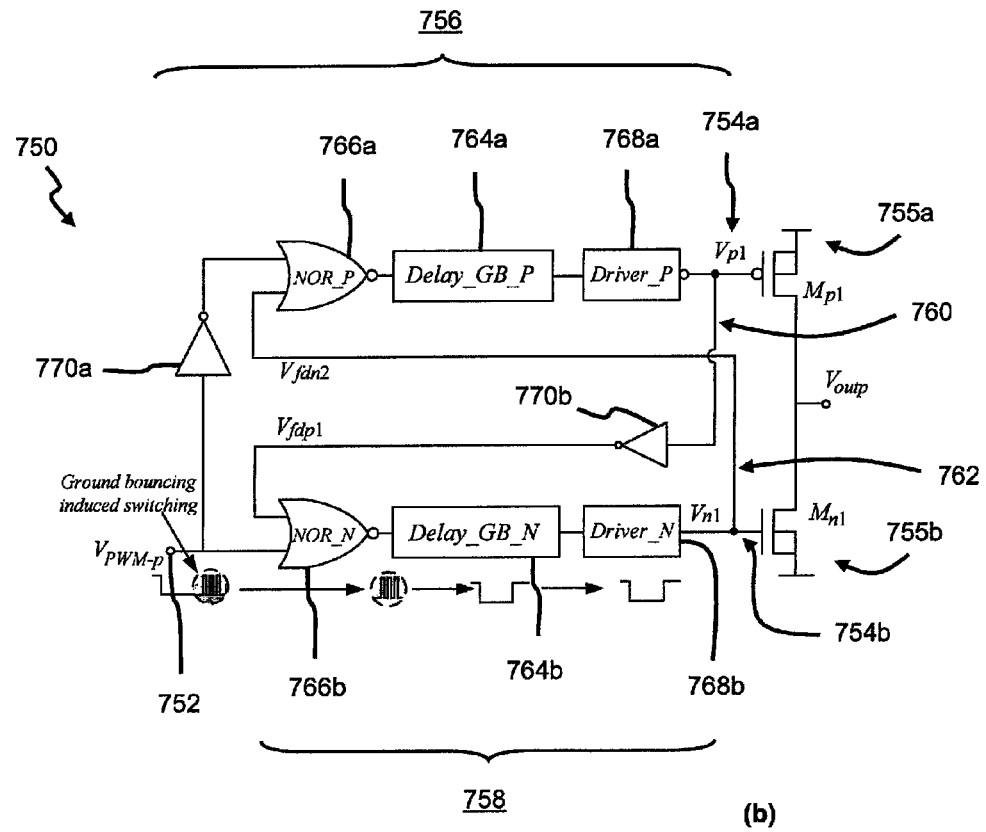

FIG. 7a shows a conventional dead-time circuit 700, while FIG. 7b shows a proposed dead-time circuit 750 configured to be incorporated in an upper branch of a BTL output stage of a switching circuit (e.g. a Class D amplifier (CDA), but not limited to as such), according to a first embodiment. The proposed dead-time circuit 750 is hereinafter referred to as the first dead-time circuit 750. As a background, dead-time circuits are commonly employed to prevent simultaneous switching-on both the high-side and low-side power transistors of output stages. Specifically in this instance, the first dead-time circuit 750 is arranged to be ground-bounce-insensitive, and is thus able to significantly reduce false switching in the said output stage due to ground-bounce occurrences, and beneficially, with minimal hardware overheads incurred.

Particularly, the first dead time circuit 750 comprises an input 752 for receiving a switching signal of the switching circuit with at least one supply rail (not shown) having a ground bounce signal; first and second outputs 754a, 754b (which are in turn respectively coupled to first and second power transistors 755a, 755b labelled as $M_{p1}$, $M_{n1}$); a first feedforward path 756 coupled to the first output 754a and arranged to receive the switching signal; a second feedforward path 758 coupled to the second output 754b and arranged to receive the switching signal; a first feedback path 760 forming a first feedback loop between the first output 754a and the second feedforward path 758; and a second feedback path 762 forming a second feedback loop between the second output 754b and the first feedforward path 756. The first and second outputs 754a, 754b are respectively labelled as $V_{P1}$ and $V_{n1}$ in FIG. 7b. The switching signal is labelled as $V_{PWM-P}$ (in FIGS. 7a and 7b) and is ground-bounce induced. Each of the first and second feedforward paths 756, 758 is arranged to include a respective first and second delay circuit 764a, 764b (i.e. labelled as Delay_GB_P and Delay_GB_N), each having a time delay greater than a predetermined time period of the ground bounce signal. Further, each of the first and second feedforward paths 756, 758 also includes a respective first and second NOR gate 766a, 766b (i.e. labelled as NOR_P and NOR_N), as well as a respective first and second driver circuit 768a, 768b (i.e. labelled as Driver_P and Driver_N). A first inverter 770a is arranged between the input 752 and the first NOR gate 766a, whereas a second inverter 770b is arranged in the first feedback path 760.

It is to be appreciated that the output of the first NOR gate 766a is coupled to an input of the first delay circuit 764a, and the output of the first delay circuit 764a is coupled to the first driver 768a for boosting a first delayed signal from the first delay circuit 768a. Similarly, the output of the second NOR gate 766b is coupled to an input of the second delay circuit 764b, and the output of the second delay circuit 764b is coupled to the second driver 768b for boosting a second delayed signal from the second delay circuit 768b.

The configuration of the first dead time circuit 750 differs from the conventional dead time circuit 700 in that (for the first dead time circuit 750) the first and second delay circuits 784a. 764b are positioned respectively in the first and second feedforward paths 756, 758, whereas for the conventional dead time circuit 700, the corresponding delay circuits are instead positioned respectively within the associated feedback paths. That is, placement of the remaining components of the first dead time circuit 750 is largely the same as in the conventional dead time circuit 700, except for the above explained. For good order, it is to be highlighted that like components in the conventional dead-time circuit 700 to those in the first dead-time circuit 750 are described below using the same reference numerals, but with additional inclusion of "'" to the said reference numerals.

Furthermore, for the first dead time circuit 750, the delay of the first and second delay circuits 764a, 764b is purposefully configured to be longer than $t_{GB}$ (i.e. a period of the ground-bounce). More specifically, it is to be appreciated that a delay of the first and second delay circuits 764a, 764b to be configured is design-dependent in that the delay may depend on supply voltage, switching frequency of the CDA, parasitic capacitance/inductance/resistance, inductance of the bonding wire, and etc. In this embodiment, the delay is configured to be about 2 ns. However, in the conventional dead time circuit 700, the delay of the associated delay circuits 764a', 764b' (i.e. labelled as Delay_P and Delay_N in FIG. 7a to differentiate from Delay_GB_P and Delay_GB_N) is configured to be shorter than $1/f_{GB}$ (i.e. $f_{GB}$ is a frequency of the ground-bounce). It is also to be appreciated that the value of $t_{GB}$ is determined by the inductance of any bonding wires, decoupling capacitors used and/or parasitic capacitance of the switching circuit (e.g. an amplifier) itself. A value of $t_{GB}$ may be obtained via simulations/experiments, but a general estimate of $t_{GB}$ may be obtained from equation (1):

$$t_{GB} = 2p(LC)^{0.5} \qquad (1)$$

wherein L is the inductance of a bonding wire and C is the total capacitance between supply rails (including a decoupling capacitor and parasitic capacitance).

To understand why the conventional dead-time circuit 700 suffers from false switching, an explanation is provided with reference to FIG. 7a. For the conventional dead-time circuit 700, the delay of the first and second delay circuits 764a', 764b' therein are shorter than $t_{GB}$—this being because the delay needed for dead time is shorter than $1/f_{GB}$. Further, as mentioned, the first and second delay circuits 764a', 764b' (of the conventional dead-time circuit 700) are respectively positioned in the first and second feedback paths 760', 762' (i.e. see FIG. 7a). As a result, the conventional dead-time circuit 700 does not prevent the false switching signal $V_{PWM-P}$ (due to ground-bounce) from propagating to the gate (i.e. generating a voltage, $V_{n1}$) of an output transistor (of the second output 754b'). For example, consider a case when $V_{p1}$ and $V_{n1}$ are both high, and false switching occurs in the switching signal $V_{PWM-P}$. $V_{p1}$ does not switch because one of the inputs to the first NOR gate 766a', $V_{fdn1}$, is held high. So any high-frequency (and hence short pulses) switching is likely to be blocked by the first delay circuit 764a' (i.e. Delay_P). However as the first delay circuit 764a' is embedded in the second feedback path 762', short pulses at the input 752' may propagate to $V_{n1}$, and hence cause the output transistor (of the second output 754b') to (false) switch. This false switching in turn induces more ground-bounce, thereby exacerbating the problem (by potentially then creating further more false pulses).

The proposed (ground-bounce-insensitive) first dead time circuit 750 of FIG. 7b is however able to mitigate the above problem. Advantageously, in the first dead time circuit 750, the ground-bounce-induced short pulses at $V_{PWM-P}$ are blocked by the second delay circuit 764b (i.e. Delay_GB_N), and thus unable to further propagate to the gate of the second output 754b (i.e. $M_{n1}$), thereby eliminating any false switching. Consequently, this improves the reliability and/or linearity characteristics of the switching circuit, in which the first dead time circuit 750 is incorporated. It is to be appreciated that an overall delay of the first dead time circuit 750 is longer than the conventional dead-time circuit 700, due to the longer delay (as configured) and the placement of the first and second delay circuits 764a, 764b. But the longer delay is largely inconsequential because the associated effects on linearity are determined to be negligible.

To reiterate, the first dead time circuit 750 is applicable in the switching circuit (for generating a switching signal), in which the switching circuit comprises a loop filter for producing a filtered signal from an input signal; a modulator for modulating the filtered signal to produce a modulated switching signal; and an output stage (which incorporates the said dead time circuit 750), wherein the modulated switching signal is delayed by the first and second delay circuits 764a, 764b to generate the switching signal for driving a load. The modulator may be a pulse width modulator, bang-bang control modulator, Sigma-Delta modulator, self-oscillation modulator or the like.

For example, the switching circuit may be audio CDAs, the high speed Class D supply modulators for RF polar amplifiers, DC-DC Converters or other suitable circuits, in which switching (with large current flow) is to be performed. Conventionally, RF polar amplifiers are used for high power RF amplifiers for base stations, but not in mobile devices. This is because the large ground-bounce issue prevents RF polar amplifiers from being used in mobile devices, and so the first dead time circuit 750 can now be seen as an "enabler" for usage of RF polar amplifiers in mobile devices.

The remaining configurations will be described hereinafter. For the sake of brevity, description of like elements, functionalities and operations that are common between the different configurations are not repeated; reference will instead be made to similar parts of the relevant configuration(s).

Figure 8:
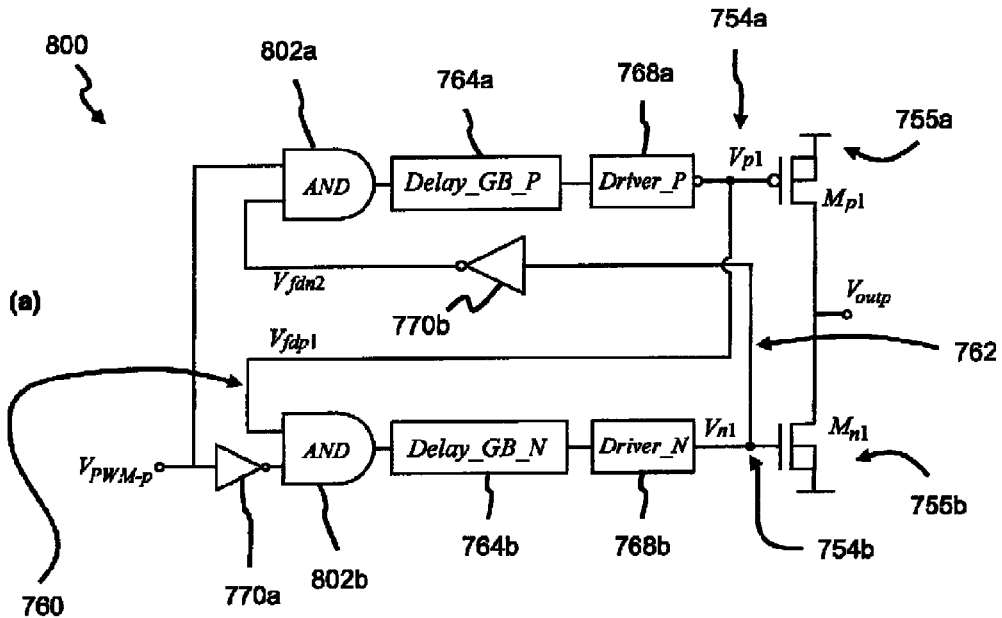
FIG. 8a shows a second dead-time circuit, based on a second embodiment.
FIG. 8b shows a third dead-time circuit, based on a third embodiment.
FIG. 8c shows a fourth dead-time circuit, based on a fourth embodiment.
Figure 8:
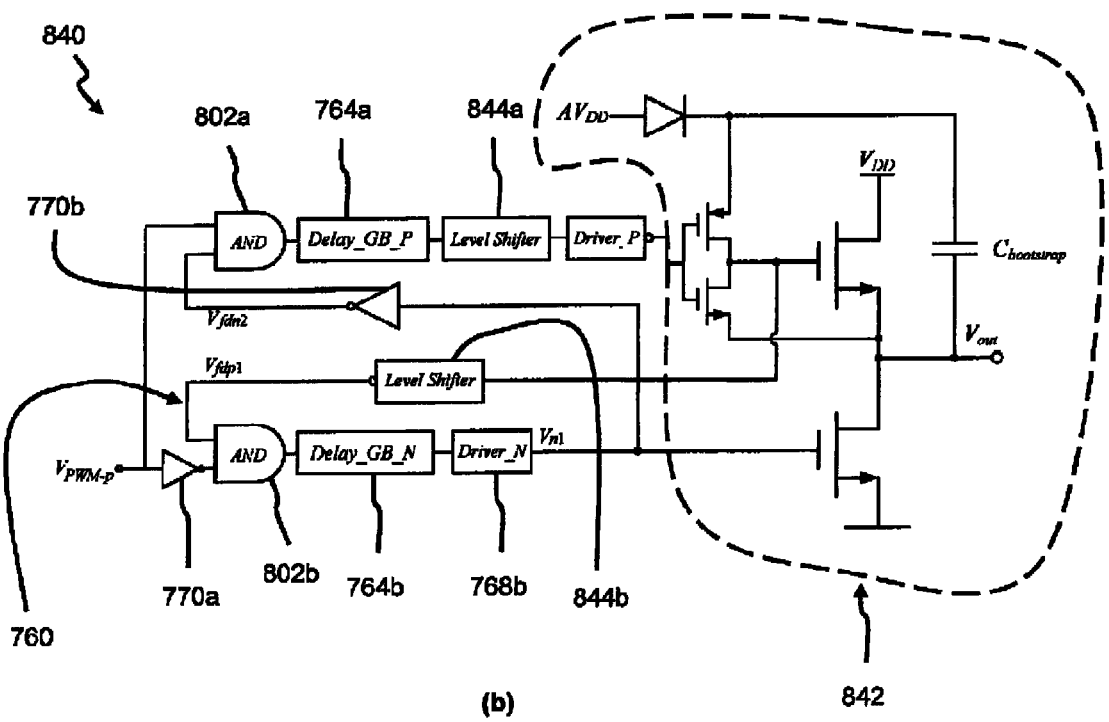
Figure 8:
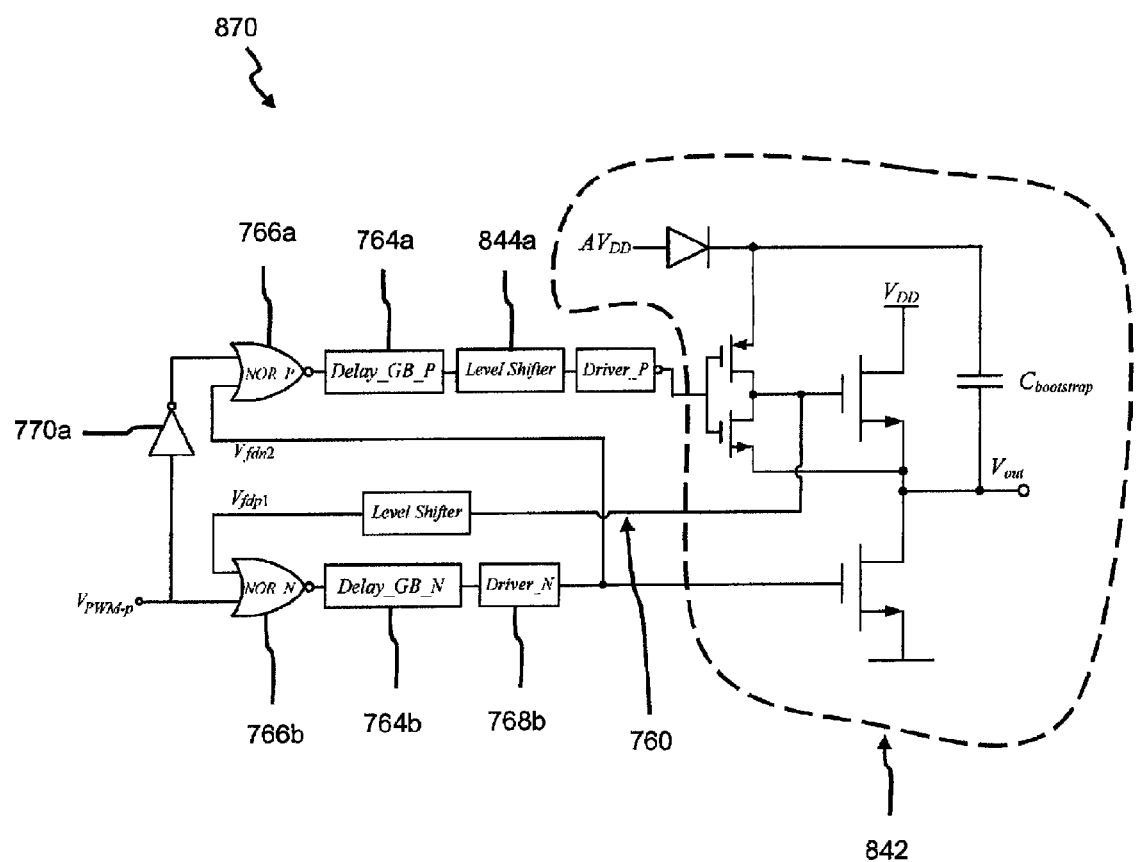

FIG. 8a shows a second dead-time circuit 800, based on a second embodiment. The second dead-time circuit 800 is largely similar in configuration to the first dead-time circuit 750, except for the following differences. The first and second NOR gates 766a, 766b are now respectively replaced by first and second AND gates 802a, 802b (i.e. both labelled as AND in FIG. 8a). Additionally, the first inverter 770a is now arranged to be positioned between the input 752 and second AND gate 802b (in the second feedforward path 758), whilst the second inverter 770b is now instead arranged in the second feedback path 762.

FIG. 8b shows a third dead-time circuit 840, based on a third embodiment. In particular, the third dead-time circuit 840 is a variant of the second dead-time circuit 800. In this case, the first and second power transistors 755a, 755b $M_{p1}$, $M_{n1}$ are replaced by an n-channel totem-pole configuration output stage 842 (wherein output transistors used therein are of n-type transistors only). A first Level Shifter 844a is also arranged in the first feedforward path 756, positioned between the first delay circuit 764a and first driver circuit 768a. Further, a second Level Shifter 844b is now arranged in the first feedback path 760.

FIG. 8c shows a fourth dead-time circuit 870, based on a fourth embodiment. The fourth dead-time circuit 870 is a variation of the third dead-time circuit 840, and the differences are explained below. The first and second AND gates 802a, 802b are replaced by the first and second NOR gates 766a, 766b, thus in this respect reverting to the similar configuration in the first dead-time circuit 750. Moreover, the second inverter 770b is omitted from the second feedback path 762, while the first inverter 770a is now re-arranged to between the input 752 and the first NOR gate 766a.

2. High-Gain Loop Filter Designs

Figure 1:
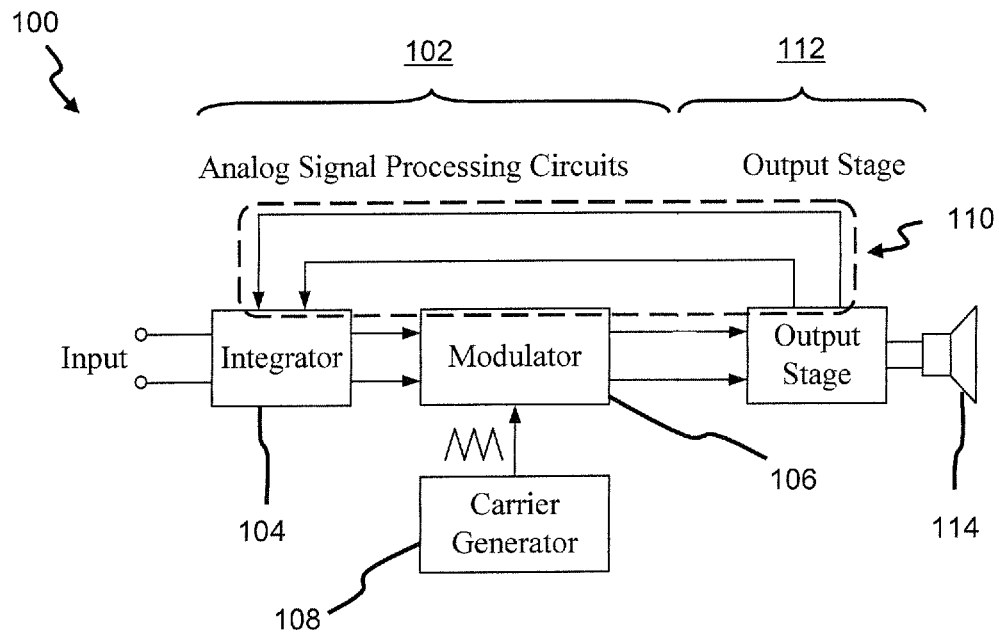
FIG. 1 is a block diagram of a Class D amplifier (CDA), according to the prior art.
Figure 2:
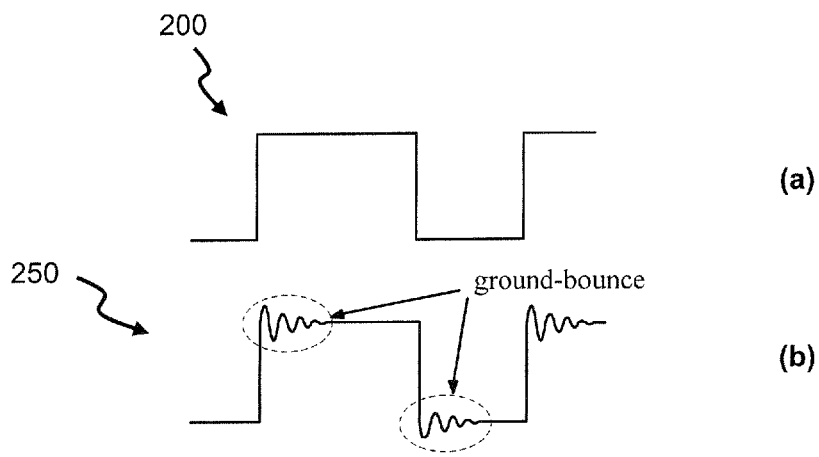
FIG. 2 includes FIGS. 2a and 2b, which respectively shows output waveforms generated by the CDA under an ideal and a practical scenario.
Figure 3:
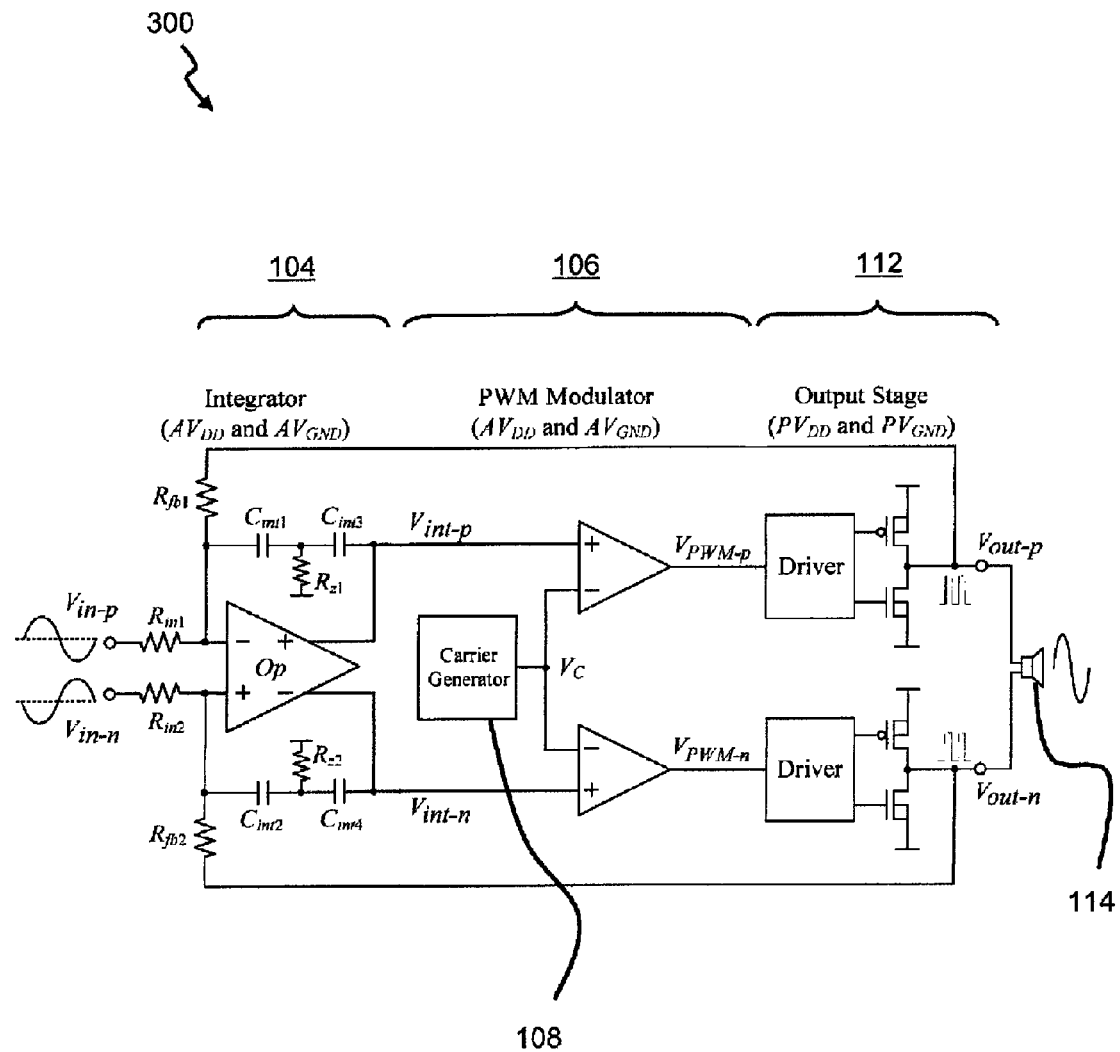
FIG. 3 is a schematic diagram of a PWM CDA, according to the prior art.
Figure 4:
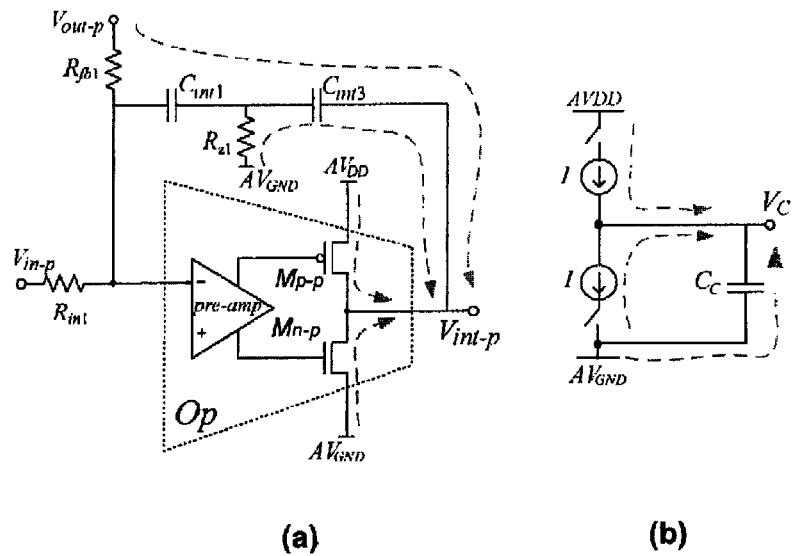
FIG. 4 includes FIGS. 4a and 4b, which respectively shows ground-bounce coupling paths at an integrator and a carrier generator of the CDA of FIG. 1.
Figure 5:
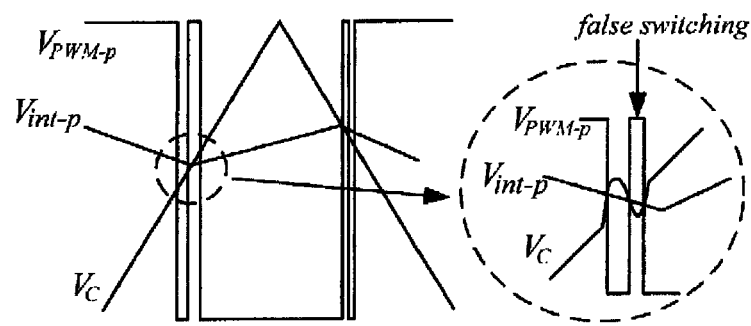
FIG. 5 depicts occurrence of false switching in a PWM signal.
Figure 6:
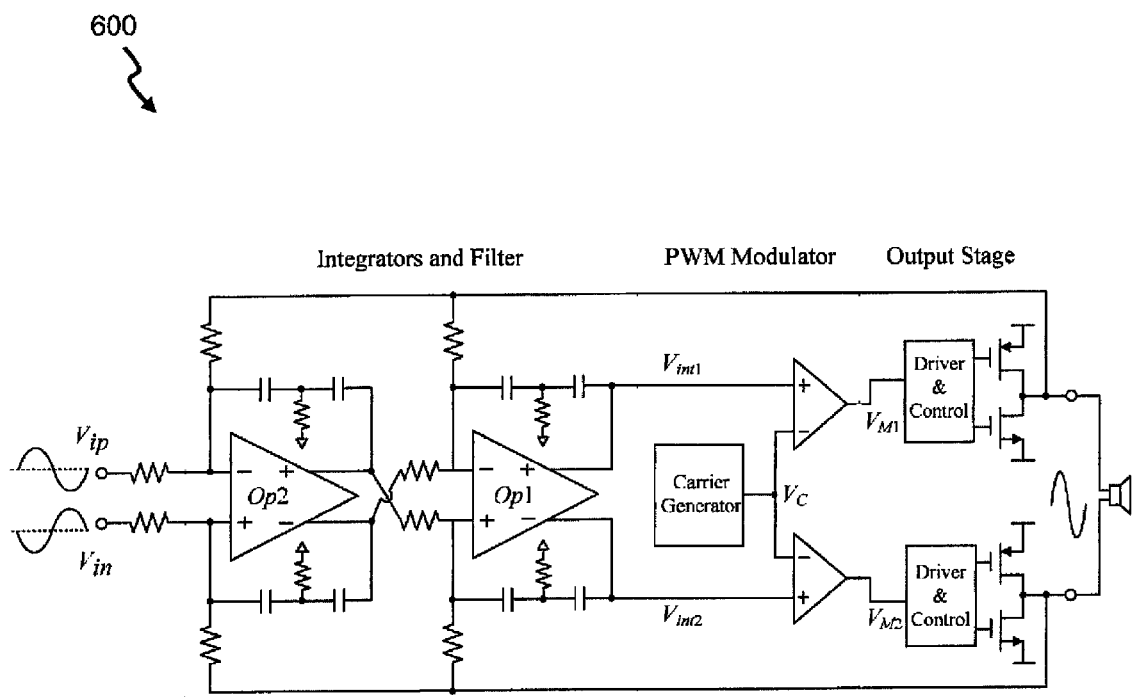
FIG. 6 is a schematic diagram of a conventional double-feedback PWM CDA.
Figure 9:
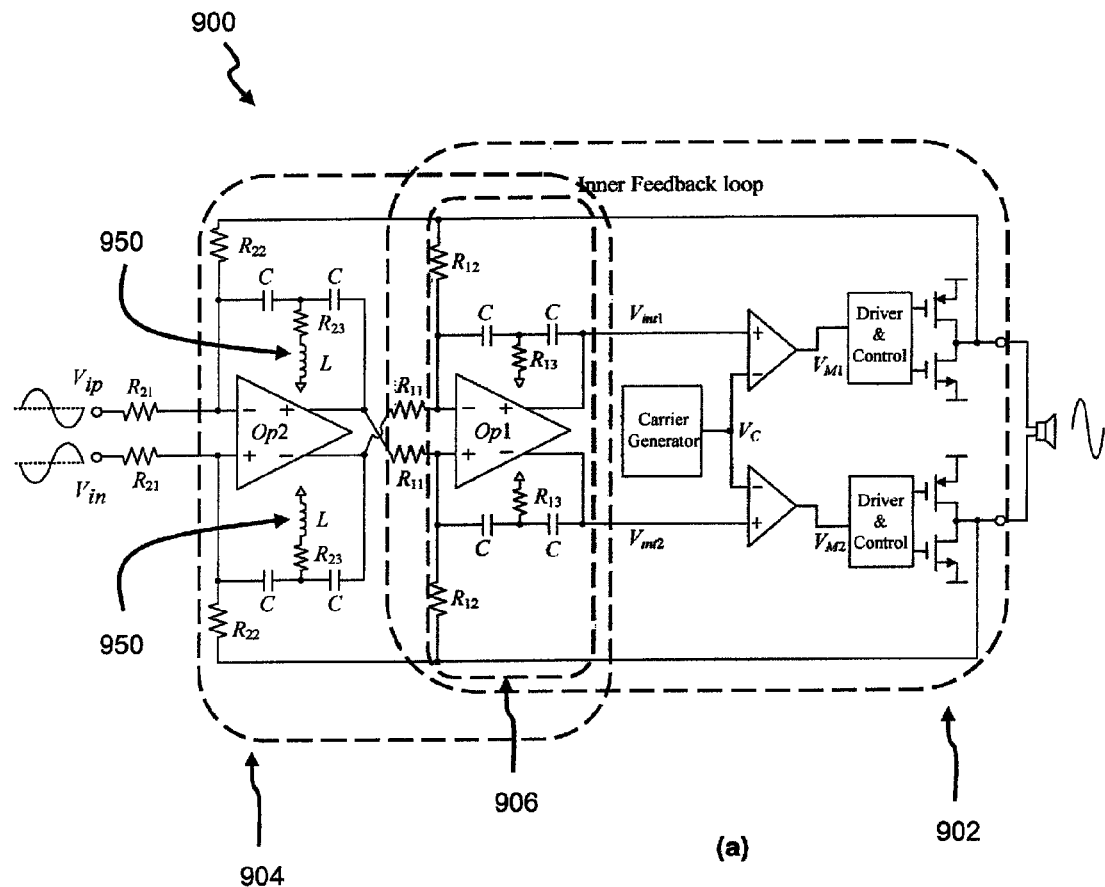
FIG. 9 includes FIGS. 9a and 9b, which are respective schematic diagrams of a proposed double-feedback PWM CDA and an inductor configuration used in the proposed double-feedback PWM CDA, based on a fifth embodiment.
Figure 9:
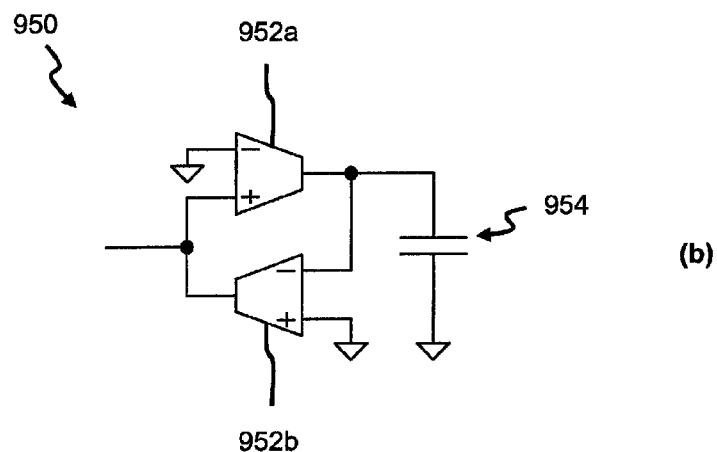

FIGS. 9a and 9b are respective schematic diagrams of a proposed double-feedback PWM CDA 900, and an active inductor 950 utilised in the proposed double-feedback PWM CDA 900, based on a fifth embodiment. It is to be appreciated that the double-feedback PWM CDA 900 differs from the conventional double-feedback PWM CDA 600 of FIG. 6 in that respective active inductors 950 are serially coupled to respective resistors labelled as $R_{23}$ and then connected to a common ground, but otherwise largely similar in the remaining circuit configuration. The double-feedback PWM CDA 900 includes a loop filter, which comprises an inner feedback loop 902 and an outer feedback loop 904 having a loop gain. The outer feedback loop 904 acts as a first integrator 904 with at least one zero and also includes a second integrator 906, wherein the inner feedback loop 902 includes a closed-loop gain comprising the second integrator 906 of the outer feedback loop 904, the closed-loop gain of the inner feedback loop 902 having at least one pole. That is, the inner feedback loop 902 and outer feedback loop 904 in configuration include the second integrator 906—see FIG. 10. Also, the terms "outer feedback loop" 904 and "first integrator" 904 will be used interchangeably hereinafter, wherever appropriate. Further, the first integrator 904 has at least one reactive element configured to generate a zero to at least partially cancel the at least one pole of the closed-loop gain of the inner feedback loop 902. In this instance, the active inductor 950 is an example of the reactive element.

The double-feedback PWM CDA 900 further includes a modulator, in which an input of the second integrator 906 is electrically coupled to the output of the first integrator 904 and to the output of the double-feedback PWM CDA 900 for producing an amplified signal. Also, an output of the second integrator 906 is electrically coupled to an input to the modulator, and an input of the first integrator 904 is electrically coupled to the output of the double-feedback PWM CDA 900. Moreover, the input of the first integrator 904 is also electrically coupled to an input of the double-feedback PWM CDA 900 for receiving a signal to be amplified.

Specifically, the first integrator 904 is arranged to have three poles and a further zero, and the closed-loop gain of the inner feedback loop 902 has one zero and a further pole. The further zero of the first integrator 904 at least partially cancels the further pole of the closed-loop gain of the inner feedback loop 902. So the reactive element functions to generate an additional pole and one additional zero, and thus eventually, the proposed double-feedback PWM CDA 900 is provided with five poles and three zeros (as opposed to only four poles and two zeros for the conventional double-feedback PWM CDA 600 of FIG. 6).

The proposed double-feedback PWM CDA 900 is configured so that an overall loop gain of the loop filter is significantly increased, while yet ensuring stability. In the loop filter, active inductor(s) may be employed in the outer feedback loop 904 (as aforementioned). In this case, the active inductor 950 is realized using first and second transconductance amplifiers 952a, 952b (connected in parallel) and a capacitor 954 (i.e. see FIG. 9b). The output of the first transconductance amplifier 952a is coupled to a negative input of the second transconductance amplifier 952b, while the output of the second transconductance amplifier 952b is coupled to a positive input of the first transconductance amplifier 952a. A negative input of the first transconductance amplifier 952a and a positive input of the second transconductance amplifier 952b are coupled to a common ground. One end of the capacitor 954 is then connected in series to the transconductance amplifiers 952a, 952b, while another end of the capacitor 954 is coupled to the same common ground as the transconductance amplifiers 952a, 952b. From the perspective of commercial CDAs, the additional IC area to include the reactive element is considered negligible in the context of the overall IC area required for the PWM CDA 900, and hence the added cost is also negligible.

It is to be appreciated that the two zeros generated by the outer feedback loop 904 are purposefully devised to cancel out the poles in the inner feedback loop 902. Ideally, a residual number of poles and zeros is to be reduced to three poles and one zero, but it is to be appreciated that for the proposed double-feedback PWM CDA 900, there is no necessity for ideal (i.e. perfect) cancellation to be achieved to derive significant improvements for the PWM CDA 900. As a result, the stability requirement may thus be relaxed—specifically, the phase shift of the loop gain of the loop filter (which has a double-feedback loop) is comparable to that of a single-feedback loop. Hence, the overall loop gain of the proposed double-feedback PWM CDA 900 is configurable to be significantly higher (e.g. about 10 dB higher at a frequency of 1 kHz) than the conventional double-feedback PWM CDA 600. Furthermore, the loop filter may also be stably configured to have triple feedback loops (to be further explained below), and hence a significantly improved loop gain (i.e. leading to significantly improved PSRR and other non-linearities) is realizable. Also for both cases, because of the increased loop gain, the PSRR and PS-IMD (and other non-linearities, including THD+N) are improved accordingly.

Figure 10:
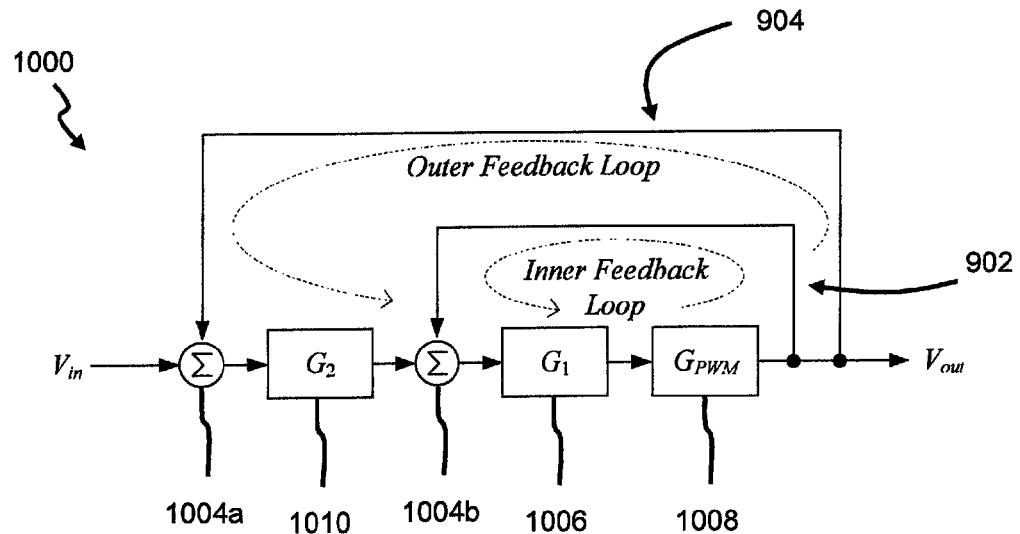

To delineate the proposed double-feedback PWM CDA 900 and also effect of the reactive element on the overall performance of the loop filter, reference is made to FIG. 10, which is a block diagram representation 1000 of the double-feedback PWM CDA 900. In FIG. 10, a first block 1006 labelled as $G_1$ is the integrator gain of the inner feedback loop 902, a second block 1008 labelled as $G_{PWM}$ is the PWM stage gain, and a third block 1010 labelled as $G_2$ is the integrator gain of the outer feedback loop. Also, a first circular block 1004a arranged on the left of the third block 1010 represents the first integrator 904, while a second circular block 1004b arranged on the right of the third block 1010 then represents the second integrator 906. Accordingly, the overall loop gain of the double-feedback PWM CDA 900 is expressed as:

$$G_{overall} = G_1 G_2 G_{PWM} + G_1 G_{PWM} \quad (2)$$

Figure 11:
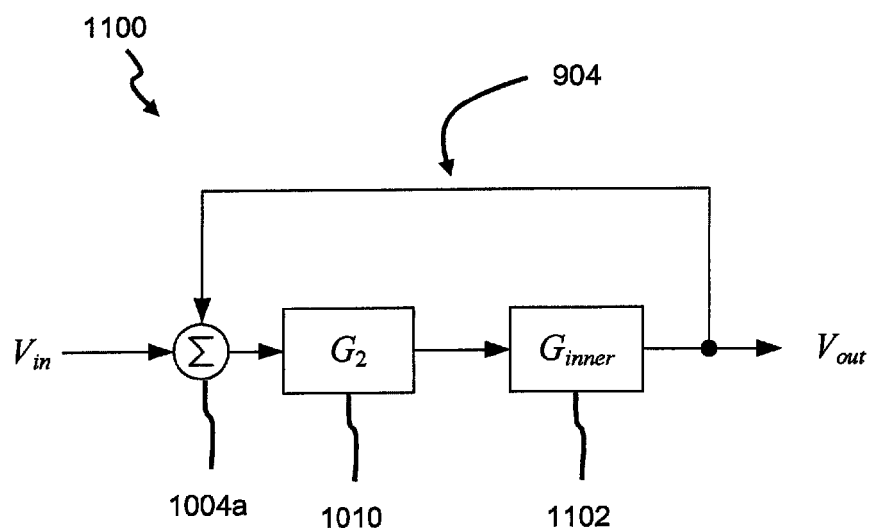
FIG. 11 is a simplified block diagram of FIG. 10.

To ensure the stability of the overall design (of the double-feedback PWM CDA 900), it is important that both the inner feedback loop 902 and the outer feedback loop 904 are stable. In this aspect, it is to be appreciated that the inner feedback loop 902 is configured as an $2^{nd}$ order integrator and so is stable. As a result, the block diagram representation 1000 of FIG. 10 may be simplified to a more streamlined representation 1100 shown in FIG. 11, where a fourth block 1102 labelled as $G_{inner}$ represents the closed loop gain of the inner feedback loop 902. Consequently, $G_2$ and $G_{inner}$ are respectively expressed as:

$$G_2 = \frac{1}{R_{22}R_{23}C^2 s^2}\left[\frac{2LCs^2 + 2R_{23}Cs + 1}{\frac{Ls}{R_{23}} + 1}\right] \quad (3)$$

$$G_{inner} = \frac{R_{12}}{R_{11}}\left[\frac{2R_{13}Cs + 1}{\frac{R_{12}R_{13}C^2 s^2}{G_{PWM}} + 2R_{13}Cs + 1}\right] \quad (4)$$

The loop gain, $G_{outer}$, of the outer feedback loop 904 is then expressed as:

$$G_{outer} = G_2 G_{inner} = \quad (5)$$
$$\frac{R_{12}}{R_{11}} \frac{1}{R_{22}R_{23}C^2 s^2}\left[\frac{2R_{13}Cs + 1}{\frac{R_{12}R_{13}C^2}{G_{PWM}}s^2 + 2R_{13}Cs + 1}\right]\left[\frac{2LCs^2 + 2R_{23}Cs + 1}{\frac{L}{R_{23}}s + 1}\right]$$

It is observed from equation (5) that if conditions (A1) and (A2) below are satisfied, then $G_{outer}$ may be simplified to equation (8). The conditions (A1) and (A2) are set out as:
Condition (A1):

$$\frac{R_{12}R_{13}C^2}{G_{PWM}}s^2 + 2R_{13}Cs + 1 = 2LCs^2 + 2R_{23}Cs + 1 \quad (6)$$

wherein $\frac{R_{12}R_{13}C^2}{G_{PWM}} = 2LC$ and $R_{13} = R_{23}$

Condition (A2):
$$2R_{13}C > L/R_{23} \quad (7)$$

Accordingly, with conditions (A1) and (A2) satisfied, the simplified expression for $G_{outer}$ is then:

$$G_{outer} = \frac{R_{12}}{R_{11}} \frac{1}{R_{22}R_{23}C^2 s^2} \frac{2R_{13}Cs + 1}{\frac{L}{R_{23}}s + 1} \quad (8)$$

That is, if the conditions (A1)) and (A2) are satisfied, the two zeros in the outer feedback loop 904 cancel the poles of the inner feedback loop 902. Hence, the proposed double-feedback PWM CDA 900 simplifies to a three pole and a one zero arrangement. More specifically, with respect to equation (5), it is to be appreciated that if the conditions (A1) and (A2) are satisfied, the positions of two zeros are the same as the positions of two poles. Hence, the two poles are cancelled by the two zeros. So effectively, the PWM CDA 900 simplifies to a three pole and one zero arrangement. The conditions (A1) and (A2) ensure a perfect pole-zero cancellation. Practically, perfect cancellation is a strict requirement to obtain a stable PWM CDA 900. The PWM CDA 900 may have a stable configuration as long as positions of the poles and zeros are close. It is however to be appreciated the positions of the poles and zeros may deviate due to process variations of resistors ("R"), capacitors ("C") and inductors ("L") arranged in the PWM CDA 900, but usually do not significantly affect the stability of the PWM CDA 900. Compared to the conventional double-feedback PWM CDA 600, a total number of poles (in the proposed double-feedback PWM CDA 900) are reduced from four to three. Effectively, the loop gain and phase shift of the outer feedback loop 904 is now equivalent to a system with a double-pole having lead-lag compensation. Hence the double-feedback PWM CDA 900 is considered to be stable. It is to be appreciated that the overall loop gain of the double-feedback PWM CDA 900 is significantly higher than that of a design based on a single-feedback loop, and also easily configurable to be significantly higher than the conventional double-feedback PWM CDA 600.

For completeness, it is highlighted that it is not necessary for perfect pole-zero cancellation to be attained (i.e. where this may be the case for practical implementations). To clarify, although a perfect pole-zero cancellation is preferred, it may be not necessary. This is because while a perfect pole-zero cancellation is designed for and intended, when a circuit of the double-feedback PWM CDA 900 is being designed, but however due to process variations (i.e. the process variations for resistors and capacitors is typically about 20%), a perfect cancellation may be difficult to attain. In the proposed double-feedback PWM CDA 900, the stability of the double-feedback PWM CDA 900 is arranged to be unaffected by said process variations, although the pole-zero cancellation is only partial (and not perfect). In this instance, although the double-feedback PWM CDA 900 is configured as a five poles and three zeros arrangement, the double-feedback PWM CDA 900 preserves the stability characteristics due to partial cancellation of the at least one pole of the closed-loop gain of the inner feedback loop 902. In this manner, the overall loop gain of the double-feedback PWM CDA 900 is thus still significantly higher than the conventional double-feedback PWM CDA 600, thereby ensuring reduced non-linearities.

The remaining configurations will be described hereinafter. For the sake of brevity, description of like elements, functionalities and operations that are common between the different configurations are not repeated; reference will instead be made to similar parts of the relevant configuration(s).

Figure 12:
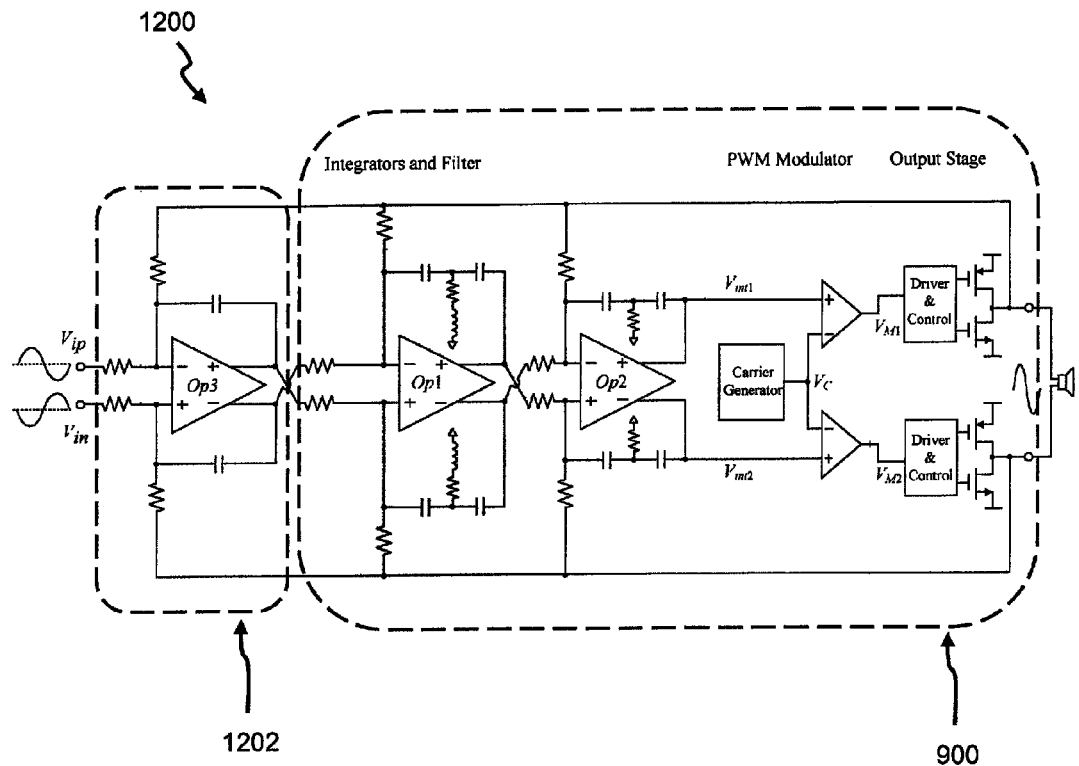
FIG. 12 is a block diagram of a proposed triple-feedback PWM CDA, based on a sixth embodiment.

A triple-feedback PWM CDA 1200 (as shown in FIG. 12), based upon the double-feedback PWM CDA 900, is now disclosed below in a sixth embodiment. Specifically, it is to be appreciated that as the overall phase shift of the loop gain of the two inner feedback loops (in the double-feedback PWM CDA 900) is equivalent to a single feedback PWM CDA, an additional feedback loop 1202 (i.e. hereafter as third feedback loop) may be included to further increase the loop gain, which then re-configures the double-feedback PWM CDA 900 to become the triple-feedback PWM CDA 1200. So, the triple-feedback PWM CDA 1200 is a combination of the double-feedback PWM CDA 900 (of FIG. 9a) with the third feedback loop 1202, whose outputs are serially coupled to the inputs of the double-feedback PWM CDA 900, as depicted in FIG. 12. The third feedback loop 1202 acts as a third integrator whose input is electrically coupled to an input of the triple-feedback PWM CDA 1200 for receiving a signal to be amplified, and to an output of the triple-feedback PWM CDA 1200. In contrast, it is highlighted that in conventional loop filters, having a triple-feedback loop arrangement generally instead causes instability or that the resulting loop gain attained is even lower than a double-feedback arrangement, due to instability.

Figure 13:
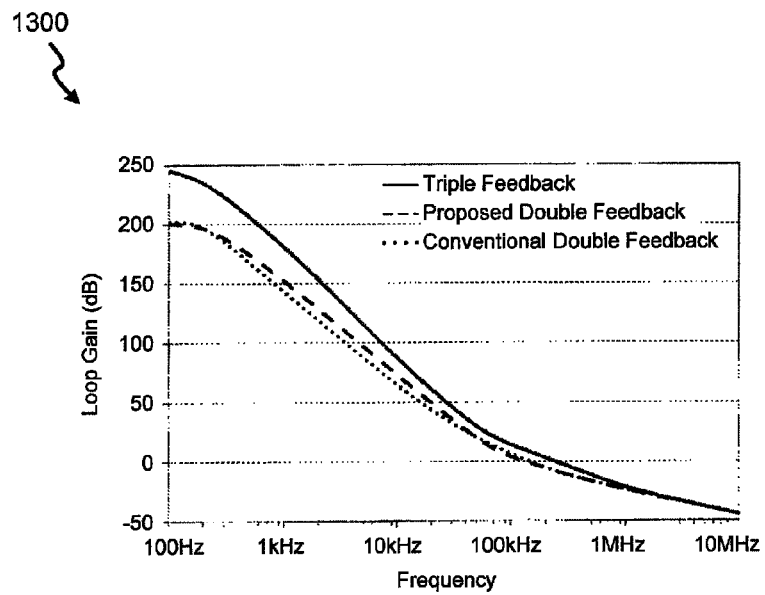
FIG. 13 is a comparison graph of loop-gains of the conventional double feedback PWM CDA of FIG. 6, the double feedback PWM CDA of FIG. 9a, and the proposed triple feedback PWM CDA of FIG. 12.

To illustrate significance of the triple-feedback PWM CDA 1200, the overall loop-gains of the conventional double-feedback PWM CDA 600 (of FIG. 6), double-feedback PWM CDA 900 (of FIG. 9a), and triple-feedback PWM CDA 1200 are shown in a comparison graph 1300 of FIG. 13. From the graph 1300, it is apparent that compared to the conventional double-feedback PWM CDA 600, the loop-gain of the proposed double-feedback PWM CDA 900 is about 10 dB higher for the frequency range of 600 kHz-20 kHz. Accordingly, this approximately translates to a significant 10 dB improvement in PSRR and PS-IMD (and other non-linearities). In contrast, the loop-gain of the proposed triple-feedback PWM CDA 1200 is comparatively higher: about 40 dB higher for frequencies less than or equal to 1 kHz, and more than 17 dB higher for frequencies between 1 kHz-20 kHz. The improved loop gain (of the proposed triple-feedback PWM CDA 1200) beneficially translates to commensurate significant improvements in the PSRR and PS-IMD (and other non-linearities).

Figure 14:
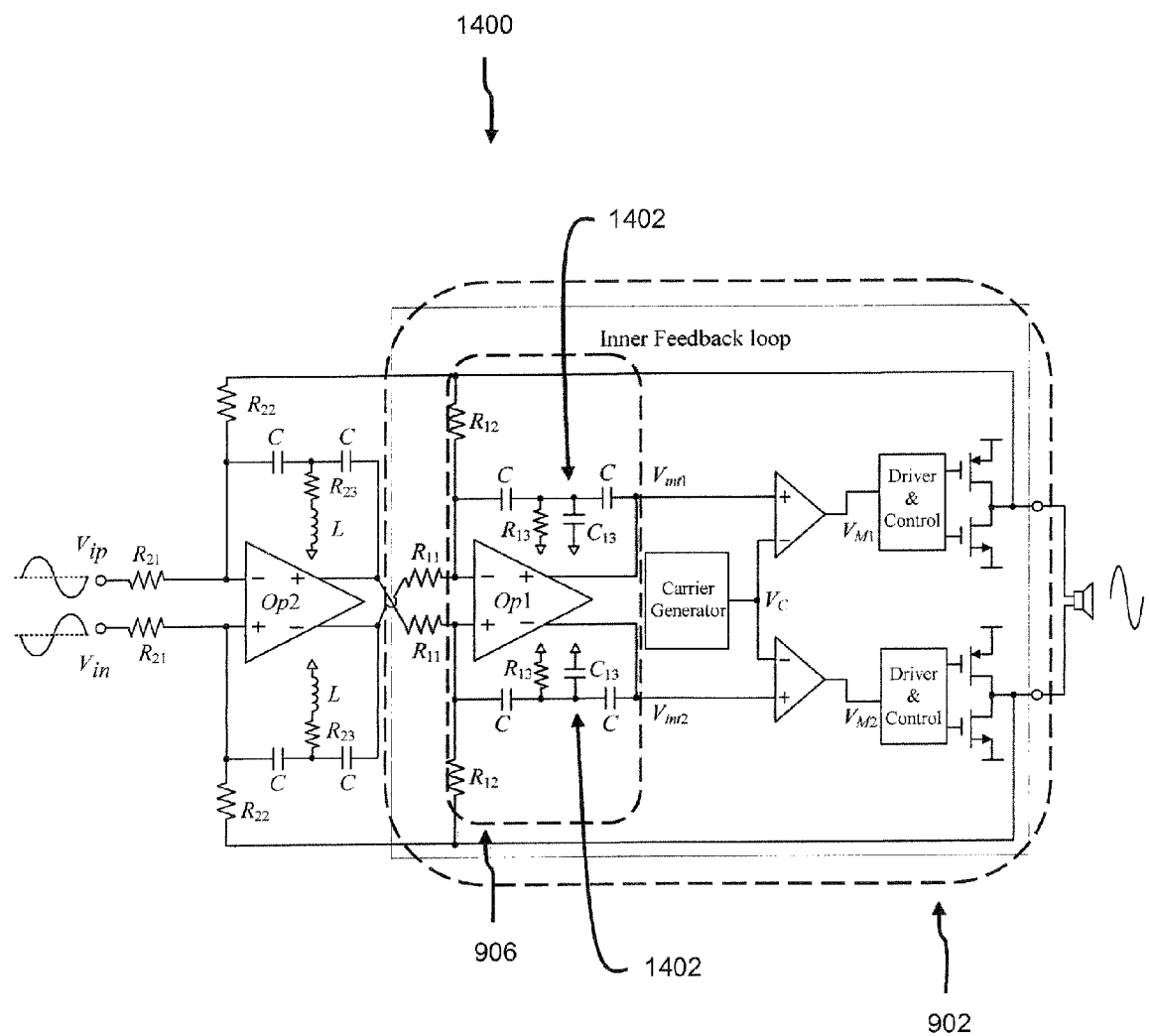
FIG. 14 is a block diagram of another double-feedback PWM CDA, based on a seventh embodiment.

FIG. 14 shows a block diagram of another double-feedback PWM CDA 1400 (having a variant loop filter), based on a seventh embodiment. The seventh embodiment is based largely upon the fifth embodiment. Particularly, compared to the double-feedback PWM CDA 900 of FIG. 9a, the present double-feedback PWM CDA 1400 is further configured with two additional identical capacitors 1402 (i.e. respectively labelled as $C_{13}$ in FIG. 14) in the second integrator 906. Each capacitor 1402 is in a parallel circuit arrangement with a corresponding resistor labelled as $R_{13}$ (also positioned in the second integrator 906), and both are coupled to a common ground. For this present double-feedback PWM CDA 1400, the closed-loop gain of the inner feedback loop 902 (of the variant loop filter), $G_{inner,alt}$, and the loop gain of the outer feedback loop 904, $G_{outer,alt}$, are thereby respectively expressed as equations (9) and (10) below.

$$G_{inner,alt} = \frac{R_{12}}{R_{11}}\left[\frac{(2R_{13}C + R_{13}C_{13})s + 1}{\frac{R_{12}R_{13}C^2s^2}{G_{PWM}} + (2R_{13}C + R_{13}C_{13})s + 1}\right] \quad (9)$$

$$G_{outer,alt} = G_2 G_{inner,alt} \quad (10)$$
$$= \frac{R_{12}}{R_{11}} \frac{1}{R_{22}R_{23}C^2s^2}\left[\frac{(2R_{13}C + R_{13}C_{13})s + 1}{\frac{R_{12}R_{13}C^2s^2}{G_{PWM}} + (2R_{13}C + R_{13}C_{13})s + 1}\right]$$
$$\left[\frac{2LCs^2 + 2R_{23}Cs + 1}{\frac{L}{R_{23}}s + 1}\right]$$

It is apparent from equation (10) that, similar to the fifth embodiment, if conditions (B1) and (B2) below are satisfied, equation (10) may be simplified to equation (13). Conditions (B1) and (B2) are set out as:

Condition (B1):

$$\frac{R_{12}R_{13}C^2s^2}{G_{PWM}} + (2R_{13}C + R_{13}C_{13})s + 1 = 2LCs^2 + 2R_{23}Cs + 1 \quad (11)$$

wherein $\frac{R_{12}R_{13}C^2}{G_{PWM}} = 2LC$ and $2R_{13}C + R_{13}C_{13} = R_{23}C$ Condition (B2):

$$2R_{13}C + R_{13}C_{13} > L/R_{23} \quad (12)$$

Accordingly, with conditions (B1) and (B2) satisfied, the simplified expression for $G_{outer,alt}$ is then:

$$G_{outer,alt} = G_2 G_{inner,alt} = \frac{R_{12}}{R_{13}}\frac{1}{R_{22}R_{23}C^2s^2}\left[\frac{(2R_{13}C + R_{13}C_{13})s + 1}{\frac{L}{R_{23}}s + 1}\right] \quad (13)$$

Similar to the fifth embodiment, for the seventh embodiment, the loop gain of the outer feedback loop 904 has a double-pole with lead-lag compensation, hence providing a stable feedback loop. An advantage of the seventh embodiment is that there is usage of a further design parameter in the form of capacitance (i.e. the two capacitors 1402, labelled as $C_{13}$ in FIG. 14), and hence provides an additional degree of design freedom for the CDA, albeit at a cost of slight increase in hardware requirements and power dissipation. Nevertheless, for the double-feedback PWM CDA 1400 (of the seventh embodiment), the overall hardware and power dissipation overheads (compared to conventional designs) are considered negligible (i.e. less than 1%) in the context of total IC area needed for the PWM CDA 1400.

For completeness, it is again to be appreciated that for practical implementations, the pole-zero cancellation is not perfect due to components variation and etc. Nevertheless, the stability condition is still provided for in the double-feedback PWM CDA 1400 (of the seventh embodiment) and so the loop gain is easily designed to be significantly higher than conventional designs, thereby obtaining the desired improvements in PSRR and PS-IMD (and other non-linearities).

In summary, the proposed loop filters are configured to beneficially improve the loop gain of double-feedback CDAs (e.g. by more than 10 dB), which consequently may translate to greater than 10 dB of improvement in PSRR and PS-IMD. Furthermore, since the phase-shift of the loop gain of the double-feedback arrangement (of the loop filter) is comparable to that of a single feedback arrangement, realization of a triple feedback PWM CDA with significantly (e.g. greater than 40 dB at a frequency of 217 Hz) higher loop gain (compared to a double-feedback arrangement) is also possible. Accordingly, the PSRR and PS-IMD are also reduced by approximately the same amount (subjected to the floor noise).

3. Relationship Between the Ground-Bounce-Insensitive Dead Time Circuit and High-Gain Loop Filter Designs It is to be appreciated that some key attributes that may qualify the performance of CDAs include PSRR, PS-IMD and THD+N. In this regard, one object of the proposed dead-time circuit 750, 800, 840, 870 is to improve the THD+N attribute. Compared to conventional dead time circuits, the proposed dead time circuit 750, 800, 840, 870 is able to largely eliminate false switching in the Class D output stage that occur due to ground-bounce. As a result, the THD+N performance is improved significantly. On the other hand, an object of the proposed (high-loop gain) loop filter is to improve all three attributes: PSRR, PS-IMD and THD+N. Compared to conventional loop filters, the proposed loop filter is advantageous in that comparatively higher loop gain may be attained, thus resulting in better PSRR, PS-IMD and THD+N. Therefore, in a further embodiment, the proposed dead-time circuit 750, 800, 840, 870 and (high-loop gain) loop filter may be incorporated in combination, if desired, in a switching circuit/amplifier (e.g. an audio CDA) to improve the PSRR, PS-IMD and THD+N attributes simultaneously. The switching circuit may be any of those as mentioned in the first embodiment, and hence not repeated for brevity.

While the invention has been illustrated and described in detail in the drawings and foregoing description, such illustration and description are to be considered illustrative or exemplary, and not restrictive; the invention is not limited to the disclosed embodiments. Other variations to the disclosed embodiments can be understood and effected by those skilled in the art in practising the claimed invention.

For example, the proposed dead-time circuit 750, 800, 840, 870 and (high-loop gain) loop filter are each independently usable without the other. Also, in respect of the proposed dead-time circuit 750, 800, 840, 870, other suitable logic gates may be used in place of the first and second NOR gate 766a, 766b (of FIG. 7b/8c) or the first and second AND gates 802a, 802b (of FIG. 8a/8b) or the first and second inverters 770a, 770b. Further, it is to be appreciated that the proposed dead-time circuit 750, 800, 840, 870 and proposed (high-loop gain) loop filter may be fabricated using the CMOS process, or any other suitable fabrication processes.

The invention claimed is:

1. A dead time circuit for a switching circuit, the dead-time circuit comprising:
   (i) an input for receiving a switching signal of the switching circuit with at least one supply rail having a ground bounce signal;
   (ii) first and second outputs;
   (iii) a first feedforward path coupled to the first output and arranged to receive the switching signal;
   (iv) a second feedforward path coupled to the second output and arranged to receive the switching signal;
   (v) a first feedback path forming a first feedback loop between the first output and the second feedforward path; and
   (vi) a second feedback path forming a second feedback loop between the second output and the first feedforward path;
   wherein each of the first and second feedforward paths includes a respective first and second delay circuit, each having a time delay greater than a time period of the ground bounce signal determined according to the equation: $t=2\pi(LC)^{0.5}$,
   where t is the time period of the ground bounce signal, L is the inductance of a bonding wire and C is the capacitance of the at least one supply rail.

2. The dead time circuit according to claim 1, wherein the first feedforward path includes a first logic gate for receiving the switching signal and an output signal from the second output via the second feedback path.

3. The dead time circuit according to claim 2, wherein the second feedback path includes a second logic gate.

4. The dead time circuit according to claim 3, wherein the second logic gate includes an inverter.

5. The dead time circuit according to claim 2, wherein the first logic gate's output is coupled to an input of the first delay circuit, and the first delay circuit's output is coupled to a first driver for boosting a first delayed signal from the first delay circuit.

6. The dead time circuit according to claim 1, wherein the second feedforward path includes a third logic gate for receiving the switching signal and an output signal from the first output via the first feedback path.

7. The dead time circuit according to claim 6, wherein the first feedback path includes a fourth logic gate.

8. The dead time circuit according to claim 7, wherein the fourth logic gate includes an inverter or a Level Shifter.

9. The dead time circuit according to claim 6, wherein the third logic gate's output is coupled to an input of the second delay circuit, and the second delay circuit's output is coupled to a second driver for boosting a second delayed signal from the second delay circuit.

10. The dead time circuit according to claim 1, wherein the second feedforward path includes third and fourth logic gates, the third logic gate for receiving the switching signal, the fourth logic gate for receiving the third logic gate's output and an output signal from the first output via the first feedback path.

11. The dead time circuit according to claim 10, wherein the third and fourth logic gates respectively include an inverter and an AND gate.

12. The dead time circuit according to claim 1, wherein the first feedforward path includes first and second logic gates, the first logic gate for receiving the switching signal, the second logic gate for receiving the first logic gate's output and an output signal from the second output via the second feedback path.

13. The dead time circuit according to claim 12, wherein the first and second logic gates respectively include an inverter and a NOR gate.

14. A switching circuit for generating a switching signal, the switching circuit comprising:
a loop filter for producing a filtered signal from an input signal;
a modulator for modulating the filtered signal to produce a modulated switching signal; and
an output stage including the dead time circuit according to claim 1,
wherein the modulated switching signal is delayed by the first and second delay circuits to generate the switching signal for driving a load.

15. The switching circuit according to claim 14, wherein the modulator includes a pulse width modulator, bang-bang control modulator, Sigma-Delta modulator or self-oscillation modulator.

16. The switching circuit according to claim 14 in the form of an amplifier or a DC-DC converter.

17. A switching amplifier comprising:
an inner feedback loop; and
an outer feedback loop having a loop gain and comprises a first integrator with at least one zero and a second integrator; wherein the inner feedback loop includes a closed-loop gain comprising the second integrator of the outer feedback loop, the closed-loop gain of the inner feedback loop having at least one pole;
the first integrator having a reactive element configured to generate a zero to at least partially cancel the at least one pole of the closed-loop gain of the inner feedback loop.

18. The switching amplifier according to claim 17, wherein
the first integrator has three poles and a further zero, and
the closed-loop gain of the inner feedback loop has one zero and a further pole.

19. The switching amplifier according to claim 18, wherein
the further zero of the first integrator at least partially cancels the further pole of the closed-loop gain of the inner feedback loop.

20. The switching amplifier according to claim 17, wherein the reactive element emulates an inductor.

21. The switching amplifier according to claim 20, wherein the inductor includes a transconductance circuit.

22. The switching amplifier according to claim 17, further comprising a modulator wherein
the second integrator's input is electrically coupled to an output of the first integrator and to an amplifier output for producing an amplified signal, and the second integrator's output is electrically coupled to an input to the modulator, and wherein
the first integrator's input is electrically coupled to the amplifier output.

23. The switching amplifier according to claim 22, wherein the first integrator's input is also electrically coupled to an amplifier input for receiving a signal to be amplified.

24. The switching amplifier according to claim 22, further comprising a third feedback loop having a third integrator, the third integrator's input is electrically coupled to an amplifier input for receiving a signal to be amplified, and to the amplifier output.

25. A switching amplifier comprising:
an inner feedback loop;
an outer feedback loop having a loop gain and comprises a first integrator with at least one zero and a second integrator; wherein the inner feedback loop includes a closed-loop gain comprising the second integrator of the outer feedback loop, the closed-loop gain of the inner feedback loop having at least one pole;
the first integrator having a reactive element configured to generate a zero to at least partially cancel the at least one pole of the closed-loop gain of the inner feedback loop; and
an output stage having a dead time circuit wherein the dead time circuit comprises:
(i) an input for receiving a switching signal of a switching circuit with at least one supply rail having a ground bounce signal;
(ii) first and second outputs;
(iii) a first feedforward path coupled to the first output and arranged to receive the switching signal;
(iv) a second feedforward path coupled to the second output and arranged to receive the switching signal;
(v) a first feedback path forming a first feedback loop between the first output and the second feedforward path; and
(vi) a second feedback path forming a second feedback loop between the second output and the first feedforward path;
wherein each of the first and second feedforward paths includes a respective first and second delay circuit, each having a time delay greater than a time period of the ground bounce signal determined according to the equation: $t=2\pi(LC)^{0.5}$,
where t is the time period of the ground bounce signal, L is the inductance of a bonding wire and C is the capacitance of the at least one supply rail.

* * * * *